(12) United States Patent
Li et al.

(10) Patent No.: US 6,370,762 B1
(45) Date of Patent: Apr. 16, 2002

(54) METHOD OF MAKING A MULTIFILAMENTARY SUPERCONDUCTING ARTICLE

(75) Inventors: Qi Li, Waltham; Theodore S. Greene, Seekonk; Gilbert N. Riley, Jr., Marlborough; William J. Michels, Brookline; William L. Carter, Chelmsford, all of MA (US)

(73) Assignee: American Superconductor Corp., Westborough, MA (US)

( * ) Notice: Subject to any disclaimer, the term of this patent is extended or adjusted under 35 U.S.C. 154(b) by 0 days.

(21) Appl. No.: 08/651,688

(22) Filed: May 21, 1996

(51) Int. Cl.$^7$ ............................................. H01L 39/24
(52) U.S. Cl. .......................... 29/599; 505/100; 505/231
(58) Field of Search .......................... 29/599; 505/100, 505/231

(56) References Cited

U.S. PATENT DOCUMENTS

| | | |
|---|---|---|
| 2,088,040 A | 7/1937 | Simons et al. |
| 5,068,219 A | 11/1991 | Hagino et al. ................. 515/1 |
| 5,246,917 A | 9/1993 | Hikata et al. ................. 505/1 |
| 5,516,753 A | 5/1996 | Ohkura et al. .............. 505/231 |

FOREIGN PATENT DOCUMENTS

| EP | 0 281 474 A2 | 9/1988 |
|---|---|---|

OTHER PUBLICATIONS

Tsai et al. "Properties of Superconducting Tapes as Functions of Mechanical Processing" *Chinese J. Phys.* 31(6–II):1055 (Dec. 1993).

James et al. "The Effect of Lubrication on Sequentially Pressed Long Lengths of BSCCO–2223 Powder in Tube Tape" Inst. Phys. Conf. Ser. No. 148; Paper presented at Applied Superconductivity, Edinburgh, Jul. 3–6, 1995.

Utsunomiya, H, et al, "Critical Current Density of Rolled Silver–Sheathed Bi(2223) Tapes," *Physica C.* 250: 340–348; 1995.

*Primary Examiner*—Carl J. Arbes
(74) *Attorney, Agent, or Firm*—Elizabeth E. Nugent; Choate, Hall & Stewart

(57) ABSTRACT

A reduced coefficient of friction, preferably created by ideal lubrication conditions, may advantageously be employed in the breakdown deformation of a precursor to a multifilamentary superconducting composite, particularly in combination with one or more high reduction breakdown drafts, to improve composite homogeneity and significantly increase the range of deformation conditions over which dimensional tolerances and $J_e$ may be optimized. Precursor composites made by this method exhibit reduced microhardness variability and fewer and less serious transverse filament defects than composites made by prior art methods. The method comprises the steps of: first, providing a precursor article comprising a metal matrix surrounding a plurality of filaments extending along the length of the article and comprising precursors to a desired superconducting ceramic; next, roll working the precursor article during a breakdown stage at a predetermined pressure and a coefficient of friction less than about 0.2, preferably less than 0.01, and preferably less than about 0.001 during each roll working draft, and, then, sintering the rolled article to obtain the desired superconducting ceramic. The coefficient of friction is preferably obtained by interposing a lubricant between the precursor article and one or more rolls, most preferably under conditions which create ideal lubrication conditions.

37 Claims, 9 Drawing Sheets

METHOD OF MAKING A MULTIFILAMENTARY SUPER-CONDUCTING ARTICLE

FIELD OF THE INVENTION

This invention relates to a process for converting multifilamentary superconducting ceramic precursors into textured and densified superconducting ceramic composite articles and to the resulting articles. More particularly, it relates to a method of rolling at a reduced coefficient of friction during the breakdown stage, which increases the efficiency of conventional deformation processing techniques used in texturing superconducting composite articles and improves the physical uniformity and performance of the resulting article.

BACKGROUND OF THE INVENTION

Since their discovery less than a decade ago, the superconducting ceramics have attracted wide interest, due to their ability to carry currents (below critical temperature, field and current values which are characteristic of each material) almost without resistive losses at relatively high temperatures, above about 20 Kelvin.

Composites of superconducting materials and metals are often used to obtain better mechanical and electrical properties than superconducting materials alone provide. These composites may be prepared in elongated forms such as wires, tapes and cables by processes such as the well-known powder-in-tube ("PIT") process, which includes the steps of: (a) forming a powder of superconductor precursor material; (b) filling a metal container, such as a tube, billet, or grooved sheet, with precursor powder and deformation processing one or more filled containers to provide a composite of reduced cross-section including one or more filaments of superconductor precursor material in a surrounding metal matrix; and (c) further thermomechanically processing the composite to form and sinter filament material having the desired superconducting properties. Multifilamentary composites with the desired number of filaments may be obtained by successive rebundling or cabling iterations, with additional deformation and thermomechanical processing steps as needed.

A key requirement for improving the Jc of polycrystalline superconducting ceramics is a high degree of densification and crystallographic alignment or texture of the superconducting grains. In conventional PIT processing, an initial deformation stage, commonly called the breakdown stage, is used to reduce a large diameter, low density precursor composite to a highly aspected, high density tape, cable or wire via one or more deformation drafts. Total reductions in excess of 40% during the breakdown stage are common. During the breakdown stage, the grains of the precursor phases are densified and physically aligned in relation to the direction of elongation, namely primarily such that the c-directions of the grains are aligned orthogonally to the desired current direction along the composite axis, which promotes good intergrain electrical connectivity after phase conversion. In fine multifilamentary composites, the breakdown stage also forms the basic shape of the filaments in order to promote reaction induced texture during subsequent heat treatments. Flat, evenly shaped filaments in which one dimension of the filament is no greater than about the longest dimension of the desired superconducting grains have been found to provide improved performance. Additional intermediate deformation stages, typically at low reductions, may be used after the breakdown stage to reduce the severity of reaction induced defects in the textured superconductor phases and to modulate the mosaic spread of its grains in order to further improve its texture. Between deformation stages, reaction sintering heat treatments are used to convert the oxide particle fragments of the precursor to the desired superconductor or to an intermediate phase, typically also a superconductor, to repair cracks induced by deformation, and to promote texturing by enhancing the anisotropic growth of the superconducting grains. Typical prior art processes use a breakdown stage followed by one to four intermediate stages for a total of two to five iterations, each typically involving multiple deformation drafts, although processes employing a breakdown stage with a single draft and, in one embodiment, no further iterations, have also been disclosed. See, for example, co-pending application U.S. Ser. No. 08/468,089, (US '089) filed Jun. 6, 1995 and entitled "Improved Deformation Process for Superconducting Ceramic Composite Conductors", which is herein incorporated in its entirety by reference. The deformation sequence may be designated by the term "nDS", in which "D" refers to the deformation step, "S" refers to the sintering or heating step and "n" refers to the number of iterations. When the steps of deforming and sintering are carried out several times, the process may be both time-consuming and expensive.

This type of uni-axial texturing has been particularly well developed for the PIT fabrication of the micaceous bismuth-strontium-calcium-copper-oxide (BSCCO) 2223 and 2212 superconducting phases ($Bi_2Sr_2Ca_2Cu_3O_{10-x}$ and $Bi_2Sr_2Ca_1Cu_2O_{8-x}$ respectively), because these oxides exhibit a modest amount of plastic deformation via the activation of the a-b plane slip systems. It is important to note that in conventional PIT processing, the deformation is applied directly to the phases of the initial precursor in the breakdown stage and to the phases of the desired superconducting ceramic or an intermediate (which typically possess either a single set of predominant slip systems as in the case of the BSCCO superconducting oxides, or no active slip system at all, as is the case with all the rare earth-containing superconducting copper oxides, the thallium-containing superconducting copper oxides and the mercury-containing superconducting copper oxides) in the remaining iterations, often called the intermediate stages.

Deformation processing of any material is complex because standard metal-working processes have both imposed stress and imposed displacement boundary conditions. In roll working, for example, standard process parameters that control these conditions include front and back tension, roll diameter, reduction, and friction coefficient. Some of these, such as tension, will most directly influence stress and others, such as reduction, will most directly influence strain. However, the influence of other process parameters, such as roll diameter and friction, is not easily predicted even in the simplest case, that of deformation of a pure metal in a system where lateral spread of the metal cannot take place. See, e.g. Avitzur, "*Handbook of Metal-Forming Processes*", Ch. 13 for a discussion of the non-linear interactions of process parameters for roll working in such a case. Lateral spread, a significant issue in the real world, complicates matters by turning a two-dimensional system into a three-dimensional one.

The situation is even more complex in a composite material for which there are discontinuities in materials parameters at each internal interface between one material and another. Where there are significant differences in mechanical properties, such as hardness, between the two materials, geometry can be very important in determining the dominant effects. The greater the differences in the material properties, the more likely it is that localized distortions will be created at the interfaces. Moreover, material properties and processing parameters can interact in unpredictable ways. For example, deformation of a precursor powder may increase its structural integrity over time due to compaction, or decrease it due to breakup of the powder grains and/or macroscopic shear failure.

Common measures of the effectiveness of the deformation process for superconducting composites are expressed as degree of texture, core microhardness, core density, filament homogeneity and filament uniformity. High core microhardness has been associated with improved texturing and core density, but excessive microhardness has been associated with cracking. Core microhardness is a measurement of the hardness of the filament material and matrix microhardness is a measurement of the hardness of the matrix material as determined by a standard test, typically an indent test at a standard weight such as the Knoop hardness test. Core density is the density of the ceramic powder. Degree of texturing is represented by a fraction between one and zero, with one representing 100% alignment of the c-axes of the ceramic grains, such that their slip planes are parallel. Filament homogeneity is represented by a standard deviation from the average cross-sectional area of all filaments in a short transverse cross-section of the article. Filament uniformity is represented by a standard deviation from the average dimension or cross-sectional area along the length of a filament. Particularly in fine multifilament composites, low filament homogeneity and low filament uniformity have been associated with reduced current-carrying capacity ($J_e$) possibly because of shear banding, cracking, or significant localized reductions in core density and texturing.

Common deformation techniques in nDS processes include extrusion, drawing, roll working, or pressing. While uniaxial pressing may be an effective method of both aligning the ceramic grains and densifying the filament cores (See Li et al, *Physica* C217, 360–366, 1993 and Korzekwa et al, *Appl. Superconduct.* 2(3/4), 261–270, 1994), pressing has at least one serious drawback in that it is not uniformly and continuously scalable to long lengths of superconducting material. The various forms of roll working, on the other hand, such as strip rolling, groove rolling, rod rolling, cover rolling, and turk's heading, are well-suited for continuous processing of long lengths of superconducting material, particularly wire, tape or cable.

However, conventional roll working more typically creates undesirable defects and distortions in the composite than static forms of deformation such as uniaxial pressing. For example, rolling may sometimes induce cracks and longitudinal and transverse shear bands of the oxide filaments in a direction disruptive to current flow. Further, certain rolling conditions lead to the undesirable distortion of the oxide/metal interface, known as "sausaging". See, Li et al. This type of distortion is illustrated in FIG. 1, in which dark regions 10 represent oxide filaments and lighter regions 12 represent a surrounding metal matrix in longitudinal cross-section. Under certain rolling conditions, an interface 14 of the composite is distorted into a rolling, wavy conformation, resulting in alternating narrow regions 16 and wide regions 18 in the oxide filaments 10. In wide regions 18, texturing and core density is reduced. These distortions occur in both monofilamentary and multifilamentary composites, but they are particularly problematic for fine multifilamentary composites such as that shown in FIG. 1, in part because the surface to volume ratio of the filaments is so much greater.

Although cracking and shear bands may present similar appearances in multifilamentary and monofilamentary composites, their causes and solutions are not necessarily the same. The flow dynamics of monofilamentary composites and multifilamentary composites during deformation, while not fully understood, are recognized to be essentially different. For example, in contrast to the matrix metal, the powder precursor has no effective tensional strength. During deformation, the matrix must act as the element that provides structural integrity for the composite. In monofilamentary composites, for example, there is one relatively large region of powder surrounded by a matrix. There are no internal structures within the powder core that assure any level of tensional stability. As a result, the authors have seen cracks develop in monofilaments under deformation conditions where cracks are not seen in multifilaments. In comparison to multifilamentary composites, where the matrix distributes forces but there are many more internal interfaces at which discontinuities occur, monofilamentary structures provide reduced sensitivity to variations in flow uniformity between the powder core and the malleable matrix metal, but greater sensitivity to non-uniform forces and flow factors within the core itself. Although the exact source of sausaging, for example, is not known, it is believed that variations in flow compatibility both within the cores and at the core/matrix interfaces are important under different conditions.

Utsunomiya et al, *Physica* C, 250, 340–348, 1995 investigates the use of multiple low reduction drafts, increased roll diameter and lubrication with mineral oil in a post-sintering intermediate rolling sequence to obtain improved $J_e$ performance in monofilamentary composites. Utsunomiya et al teaches that lubrication during the intermediate stage is associated with slight increases in texturing (but none in grain alignment). Utsunomiya et al does not consider the impact of lubrication, total deformation, or number of deformation drafts during the breakdown stage, nor does it address the issue of reducing deformation defects at all.

Cracking, formation of shear bands and sausaging may be reduced in a rolling process by the use of multiple low reduction stages. See, Korzekwa et al. for a discussion of this approach to reducing defects in monofilamentary composites. While this approach may reduce sausaging, it has not been shown to eliminate it entirely. Additionally, low reduction drafts exert only a small penetration force on the composite article, so core density remains very low. EPO 0 504 908 by Sumitomo Electric Industries (EP '908) identifies this density problem and describes the preparation of monofilament superconducting oxide wire by multiple reduction stages using high friction rolls, preferably using increasing frictional force during each successive stage. EP '908 reports increases in core density and $J_e$ caused by the increase in friction between the rolls and the composite.

In multifilamentary composites, certain rolling conditions (See Li, et al) also lead to undesirable heterogeneities among filaments in core dimensions, hardness, density and texture. This is illustrated in FIG. 2, in which dark regions 21 represent oxide filaments and lighter regions 22 represent a surrounding metal matrix in short transverse cross-section. Barrel zones 24, center dead zones 26 and extension zone 28 are undifferentiated regions of composite 20 prior to deformation, but will be subject to different stress and flow conditions during deformation which create variations in filament characteristics thereafter. Barrel zones 24 are areas where lower compressive pressure is exerted during roll working. Center dead zones 26 are areas of limited material flow due to surface friction. Under certain rolling conditions, filaments in the barrel zones 24 and center dead zones 26 at the edges of composite 20 will have lower uniformity and poorer texture than filaments in extension zone 28 of the composite 20, while the filaments in extension zone 28 will exhibit undesirable short transverse shear bands. In addition, filaments in the barrel zones 24 at the edges of composite 20 will have lower core hardness and density, as well as significantly larger and less uniform cross-sections than filaments in the other areas.

Cracking, formation of shear bands and sausaging in multifilamentary composites may also be reduced by the use of a high reduction roll working draft during the breakdown stage, as described in US '089. While this approach reduces sausaging, formation of longitudinal shear bands, and cracking, it creates multi-modal transverse shearing, a form of short transverse shearing defect which is unique to multifilamentary composites. Moreover, while using a high reduction breakdown draft reduces filament heterogeneity in the dead zones when compared to the results of multiple low reduction drafts, significant filament heterogeneity remains and further improvements are desirable.

The approach described in US '809 also has an extremely sensitive process response surface, with small variations from optimum processing parameters creating high dimensional variations and large decreases in $J_e$. This creates difficulties for large scale manufacturing, as extremely precise control over deformation conditions is hard to maintain over extremely long lengths of wire, cable or tape. Low dimensional variations are a key product specification for many applications, such as coils.

Therefore, it is an object of this invention to provide a method for forming a high performance multifilamentary superconducting article having low dimensional variation over long lengths.

It is a further object of this invention to provide a method for forming a multifilamentary article having fine and uniform superconducting ceramic filaments without multimodal transverse shearing, cracking, shear bands or sausaging.

It is a further object of this invention to provide a method for forming a multifilamentary article having reduced dead zones and improved filament homogeneity in the dead zones.

It is a further object of this invention to provide a method for forming a precursor composite having greater filament homogeneity and uniformity across deformation zones.

It is a further object of this invention to provide a method for forming a precursor composite having lower differential impact on the microhardness of the matrix and the filaments.

It is a further object of this invention to provide a method for deforming a multifilamentary superconducting article which is effective despite variations in processing conditions typical of large-scale manufacturing operations, and which may be used to optimize precursor density and uniformity in a limited number of processing steps.

SUMMARY OF THE INVENTION

The inventors have found that a reduced coefficient of friction, preferably created by ideal lubrication conditions, may advantageously be employed in the breakdown stage of deformation processing, particularly in combination with one or more high reduction drafts, to improve composite homogeneity and significantly increase the range of deformation conditions over which dimensional tolerances and $J_e$ may be optimized. Precursor composites made by this method exhibit reduced microhardness variability and fewer and less serious transverse filament defects than composites made by prior art methods.

In one aspect, the invention is a method for manufacturing a multifilamentary superconducting ceramic composite article comprising the steps of: first, providing a precursor article comprising a plurality of filaments extending along the length of the article and containing precursors to a desired superconducting ceramic, and a metal matrix substantially surrounding the filament; next, roll working the precursor article during a breakdown stage at a predetermined pressure and a coefficient of friction less than about 0.2 during each roll working draft and, then, sintering the rolled article to obtain the desired superconducting ceramic. The coefficient of friction is preferably less than about 0.01 and most preferably less than about 0.001 during each roll working draft.

In another aspect, the invention is a method for manufacturing a multifilamentary superconducting ceramic composite article comprising the steps of: first, providing a precursor article comprising a plurality of filaments extending along the length of the article and containing precursors to a desired superconducting ceramic, and a metal matrix substantially surrounding each filament; next, roll working the precursor article during a breakdown stage at a predetermined pressure while using a lubricant between the article and one or more rolls during at least one roll working draft; and, then, sintering the rolled article to obtain the desired superconducting ceramic. It is most preferred that the lubricant be selected to create ideal lubrication conditions, that is, to maintain the coefficient of friction between the article and one or more rolls at less than about 0.001 throughout each roll working draft. However, boundary lubrication conditions, in which the coefficient of friction ranges from about 0.01 to about 0.001, and even marginal lubrication conditions, in which the coefficient of friction ranges from about 0.2 to about 0.01 and some contact between the article and the rolls does occur, may also be effective.

These methods are applicable to any deformation process which employs roll working during one or more drafts of the breakdown stage, but are particularly effective for processes in which there is at least one high reduction roll working draft during the breakdown stage. The pressure during each roll working draft is preferably greater than about 1 MPa, and most preferably greater than 10 MPa. It is preferred that the total reduction achieved in the breakdown stage be on the order of 40% to 95%. Most preferably, a single high reduction roll working draft is used during the breakdown stage and no further reduction of the article in excess of about 10% (preferably less than 5%) occurs after the high reduction roll working draft and before the first sintering operation. By "no further reduction of the article in excess of about 10% occurs after the high reduction roll working draft" is meant that no other deformation processing occurs during the breakdown stage after the high reduction roll working draft and before the sintering step. However, it is contemplated that the breakdown stage may be the initial step in an nDS process where n is greater than 1, so that additional deformation, including lubricated or unlubricated roll working, and sintering steps may occur in other DS steps and still be within the scope of this invention. In addition, other processing operations may be contemplated at this stage and, of course, later stages, of the process including an ODS (oxide dispersion strengthening) treatment, anneals, shaping, machining, cabling, coiling, winding or other chemical or mechanical processing.

It is preferred that the deformation process be an nDS process, where n is no greater than 5. In one aspect, it is preferred that n be 1, i.e., that the breakdown stage be the last stage in which significant deformation of the article occurs, although minor deformation incidental to other operations such as finishing, forming or cabling may of course occur thereafter. In another aspect, it is preferred that n be equal to 2 or 3, that the total reduction achieved during the breakdown stage be on the order of 40% to 95%, and that the total reduction achieved in the intermediate stages be on the order of 2% to 25%.

By "roll working", as that term is used herein, is meant the process of passing a precursor article such as a round wire or rectangular tape through a constrained gap of one or more, i.e., a pair or a four-way turks head arrangement, of rollers, so that deformation and reduction in at least one lateral dimension of the article results. By "draft" as that term is used herein, is meant the reduction in thickness of an elongated superconducting article in a single deformation operation. A "stage" as that term is used herein, comprises one or more successive drafts, with or without roll working but without intermediate sintering operations.

By "sintering", as that term is used herein, is meant heat treatment of the composite precursor article under conditions sufficient to convert a portion of the precursor into the desired superconducting ceramic. Where the desired superconducting ceramic is BSCCO 2223, sintering preferably includes heating at a first temperature in the range of 800–850° C., heating at a second temperature in the range of 700–840° C. and heating at a third temperature in the range of 600–800° C. Sintering includes heating at an oxygen partial pressure of 0.0001 to 100 atm. By "anneal" is meant a heat treatment under conditions which create no substantial phase changes in the desired superconducting oxide or its precursor.

The invention provides multifilamentary superconducting composite articles and rolled precursor articles with improved uniformity in filament microhardness, filament shape and aspect ratio, and filament/matrix microhardness. The rolled precursor article and resulting superconducting ceramic composite article are preferably elongated forms such as wires, tapes, cables, or current leads, and may comprise twisted or untwisted filaments. By "aspect ratio'" is meant the ratio of the width to the height of the filament or article, as measured in transverse cross-section.

In one aspect, the invention provides a rolled precursor article comprising a plurality of filaments extending along the length of the article and containing precursors to a desired superconducting ceramic, and a metal matrix substantially surrounding each filament, the precursor article having a difference between the average microhardness of the filaments and the average microhardness of the matrix of less than about 40, as measured by the Knoop hardness number with a load of 10 grams. In another aspect, the invention provides a rolled precursor article comprising a plurality of filaments extending along the length of the article and containing precursors to a desired superconducting ceramic, and a metal matrix substantially surrounding each filament, in which all filaments have a microhardness between about 100 and 160, as measured by the Knoop hardness number with a load of 10 grams. In another aspect, the invention provides a rolled precursor article comprising a plurality of filaments extending along the length of the article and containing precursors to a desired superconducting ceramic, and a metal matrix substantially surrounding each filament, in which the difference in average filament microhardness among deformation regions is less than about 40, as measured by the Knoop hardness number with a load of 10 grams.

In another aspect, the invention provides a rolled precursor article comprising a plurality of filaments extending along the length of the article and containing precursors to a desired superconducting ceramic, and a metal matrix substantially surrounding each filament, in which the aspect ratio of each filament is at least about 3. In another aspect, the invention provides a rolled precursor article comprising a plurality of filaments extending along the length of the article and containing precursors to a desired superconducting ceramic, and a metal matrix substantially surrounding each filament, in which the aspect ratio of each filament is at least about 15% of the aspect ratio of the article, as measured in transverse cross-section.

In another aspect, the invention provides a multifilamentary superconducting ceramic composite article which comprises a plurality of filaments extending along the length of the article and containing a desired superconducting ceramic, and a metal matrix substantially surrounding each filament, in which the aspect ratio of each filament is at least about 3. In another aspect, the invention provides a multifilamentary superconducting ceramic composite article which comprises a plurality of filaments extending along the length of the article and containing a desired superconducting ceramic, and a metal matrix substantially surrounding each filament, in which the aspect ratio of each filament is at least about 15% of the aspect ratio of the article, as measured in transverse cross-section.

The invention may be practiced with the precursors of any desired superconducting ceramic which requires texturing and may be entirely or partially textured by deformation. The compounds are preferably precursors of superconducting oxides, and particularly of the bismuth, rare earth, thallium or mercury families of superconducting copper oxides. Precursors of the bismuth family, and particularly its 2223 phase, are most preferred. By "precursor" is meant any material that can be converted to a desired superconducting ceramic upon application of a suitable heat treatment. Where a superconducting oxide is the desired superconducting ceramic, for example, precursors may include any combination of elements, metal salts, oxides, suboxides, oxide superconductors which are intermediate to the desired oxide superconductor, or other compounds which, when reacted in the presence of oxygen in the stability field of a desired oxide superconductor, produces that superconductor.

In preferred embodiments, the metal matrix includes a noble metal. By "noble metal" is meant a metal whose reaction products are thermodynamically unstable under the reaction conditions employed relative to the desired superconducting ceramic, or which does not react with the superconducting ceramic or its precursors under the conditions of manufacture of the composite. The noble metal may be a metal different from the metallic elements of the desired superconducting ceramic, such as silver, oxygen dispersion strengthened (ODS) silver, or a silver/gold alloy, but it may also be a stoichiometric excess of one of the metallic elements of the desired superconducting ceramic, such as copper. Silver (Ag), ODS silver, and silver alloys are the most preferred noble metals.

BRIEF DESCRIPTION OF THE DRAWINGS

The foregoing and other features, objects, aspects and advantages of the invention will become more apparent from the detailed description of the preferred embodiments which follows, and from the drawings, in which.

DETAILED DESCRIPTION OF THE PREFERRED EMBODIMENTS

Figure 1:
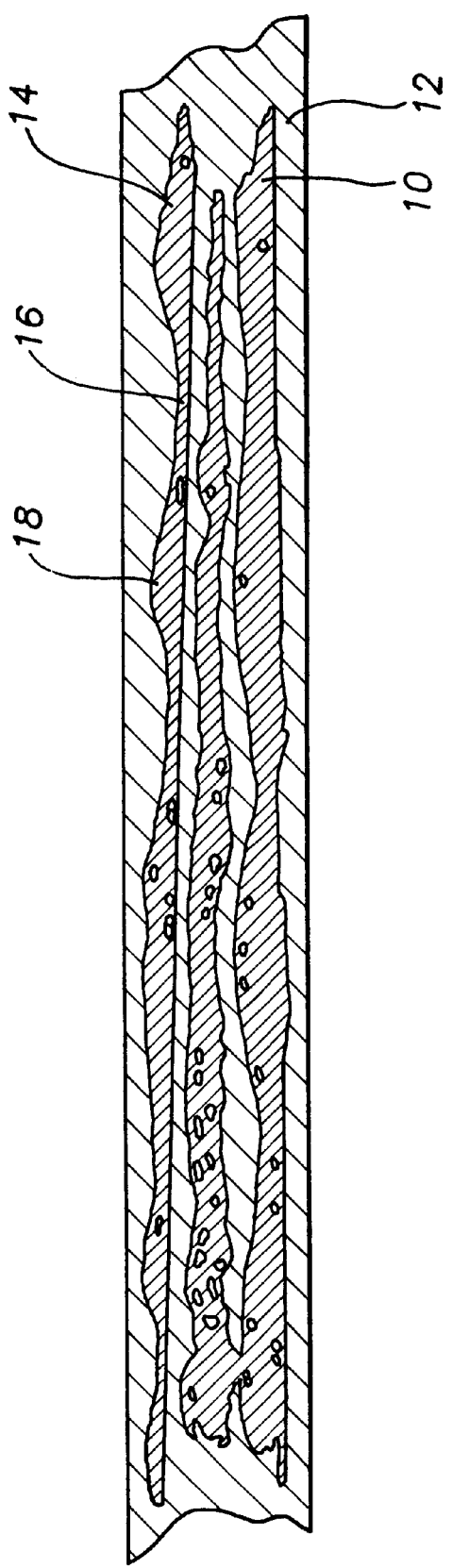
FIG. 1 is a schematic diagram of a longitudinal cross-section of an elongated superconducting ceramic composite of the prior art (FIG. 1 from SPR).
Figure 2:
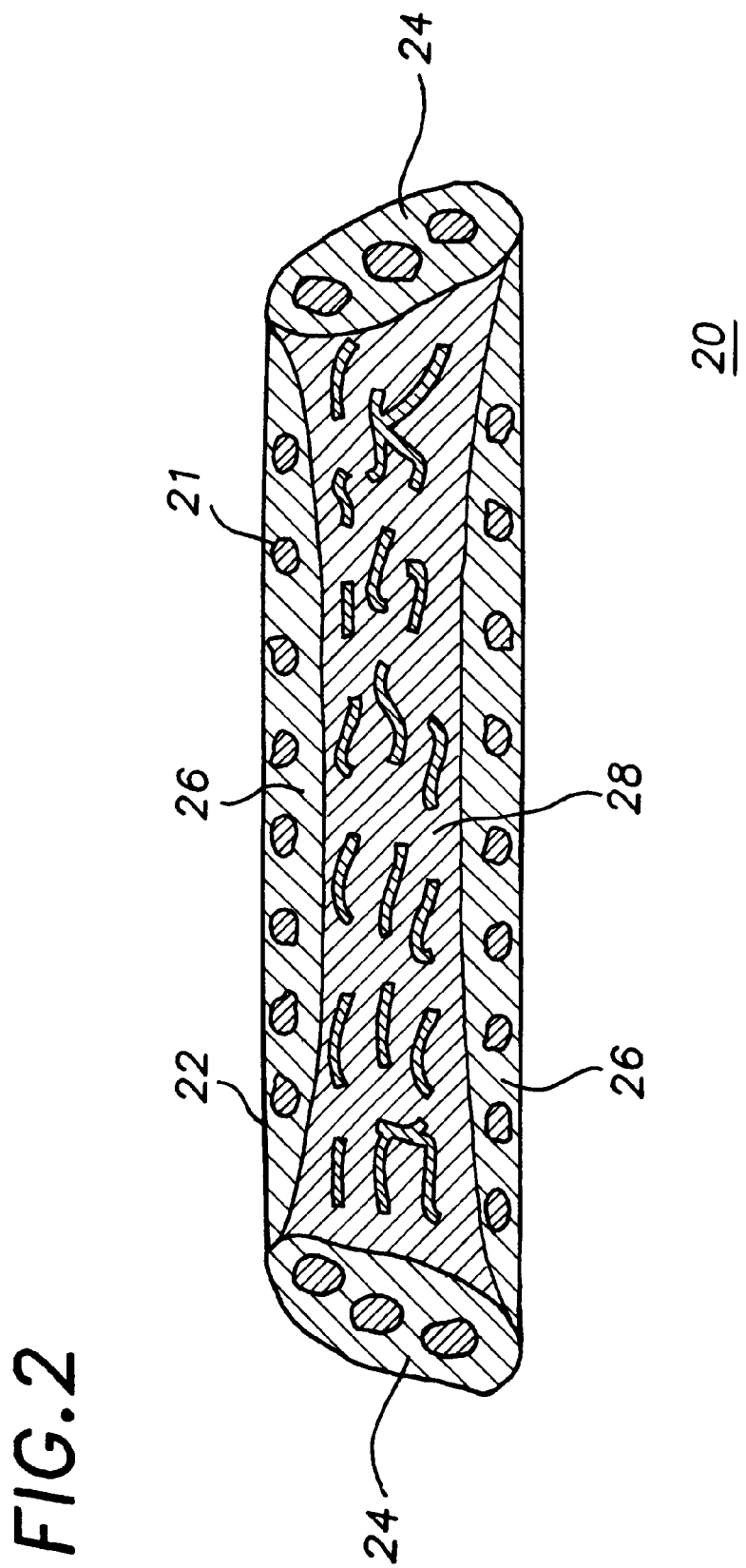
FIG. 2 is a schematic diagram of a short transverse cross-section of an elongated superconducting ceramic composite of the prior art (FIG. 10 from Bill's 12/1 report).

The inventors have found that interposing a lubricant or otherwise reducing the coefficient of friction between the precursor article and one or more rolls during a breakdown roll working draft results in marked improvements in product quality. The inventors have observed experimentally that using lubrication during the breakdown stage makes a large and statistically significant contribution to improving composite performance and uniformity and dramatically reduces the number of defects, while using lubrication during intermediate stages makes little or no difference in any of these areas. Any method of reducing the coefficient of friction on the rolls to less than about 0.2, preferably less than 0.01, and most preferably less than about 0.001, may be used. As will be further explained below, methods which create ideal lubrication conditions are preferred. These methods are applicable to any deformation process which employs roll working during one or more drafts of the breakdown stage. The total force on the composite article during any roll working draft includes a compression component and longitudinal and transverse shear forces enhanced by surface friction ($F=f \times L$, where f is the friction coefficient and L is the pressure from the roll). While not wishing to be bound by this explanation, the inventors believe that shear forces account for many of the composite non-uniformities and defects which develop during rolling. A number of variables, such as high article thickness and small roll diameter have been experimentally associated with high relative shearing forces. Shearing forces are a particularly serious source of defects during the breakdown stage, in part because of the large article thickness and in part because at low relative core density discontinuities at the filament interfaces are maximized and the composite article is less resistant to defect formation than it will be during later deformation steps. Under ideal conditions, compression would be maximized and shear forces minimized during the breakdown stage, but this is difficult to accomplish because any moving load such as a rotating roller creates both components. Lubrication dramatically decreases the friction coefficient between the roller and the composite article. Typically, the friction coefficient between a silver matrix and a steel roll would be on the order of 0.2 to 0.6. Ideal lubrication conditions, which may be obtained with a wide variety of lubricants, typically occur at a friction coefficient less than about 0.001 and most typically at about 0.0003. Boundary lubrication conditions typically occur at friction coefficients in the range of about 0.01 to 0.001. Marginal lubrication conditions typically occur at coefficients in the range of about 0.2 to 0.01.

Ideal lubrication conditions are preferred not only for their low coefficient of friction but because they modify the separating force, stress distribution within the composite and pressure dynamics in ways which have unexpectedly beneficial effects on composite formation. The inventors have found that ideal lubrication conditions significantly reduces the separating force on the rollers, as shown in Example 3, creating a pressure on the composite article which is 25% to 50% lower than it would be without lubrication at a constant roll gap. The prior art has associated reduced pressure with lower microhardness and reduced $J_e$. As shown in Examples 3 and 6, the lubricated samples do have slightly reduced filament microhardness overall, though not of the order that would be expected given the significant reduction in separating force. However, average matrix microhardness actually increases. The inventors believe that the combined effect of reducing both the coefficient of friction and the separating force is first, to reduce the shear forces on the article by several hundred times under ideal lubrication conditions; second, to modify the pressure dynamics by shifting the neutral point in the direction of the roll exit toward the point where the pressure is vertical so that, in contrast to the unlubricated case, essentially the entire separating force is applied to the article as compression; and, third and most important, to alter the stress dynamics within the composite in ways which minimize defect creation. As exemplified in Examples 3 and 6, microhardness measurements of samples made with and without the use of lubrication demonstrate that they are subject to different stress distributions.

The invention provides rolled precursor articles with more uniform filament shape and microhardness, particularly when filaments in different deformation zones are compared. When ideal lubrication conditions are employed, the highest average filament microhardness is reduced below about 160, as measured by the Knoop hardness number (Knf) with a load of 10 grams. Higher microhardnesses have been correlated with cracking defects, which are characteristic of the center-edge dead zones and central extension zone in prior art composites. Even under the partial lubrication conditions typical of boundary and marginal lubrication, the difference in average filament microhardness between the deformation regions with lowest hardness, typically the edge barrel zones, and the filament regions with highest hardness, typically the dead zones or the center extension zone, is reduced to less than about 40, as measured by the Knoop hardness number with a load of 10 grams, and $J_e$ improvements are observed. Under ideal lubrication conditions, the difference is reduced to less than about 25 Knf. Typically, composites made by prior art processes would have filaments in the barrel zones with less than half the microhardness of filaments in the other areas, whereas by use of preferred embodiments of the present invention, filaments having more than 50% and as much as 100% of the microhardness of filaments in the center extension zone are obtained. Filament shapes in the barrel zones are typically made flatter and more uniform, with aspect ratios typically greater than about 3, and their average microhardness is increased, typically to above about 100 Knf. In addition, the proportion of the composite falling outside the center extension zone is reduced, so that a larger proportion of filaments are subjected to optimal shaping forces.

The difference between the average microhardness of the matrix and the average microhardness of the filaments also decreases, both region by region and overall. The differences in microhardness between the filaments and the matrix are reduced in each of the three deformation zones. In preferred embodiments of the invention, the average microhardness difference between filaments and matrix in any of the three zones will typically not exceed 40 Knf while the variation between filaments and matrix may be 100 Knf or more in the center-edge dead zones of prior art composites. The overall difference between the average microhardness of the filaments and the average microhardness of the matrix in the precursor article is typically less than about 40 and for ideal lubrication conditions typically less than about 25, as measured by the Knoop hardness number with a load of 10 grams. The net effect of the increased composite uniformity is to decrease the number and severity of localized distortions at the filament/matrix interfaces, where many of the undesirable defects which were discussed earlier are believed to originate in multifilamentary composites.

Lubrication is expected to improve the $J_e$ response surface, providing high performance over a wider range of draft conditions. While not wishing to be bound by these explanations, the inventors believe that at breakdown reductions below the optimum, lubricated roll working provides more uniform deformation for a larger proportion of filaments due to reduced stick and slip distribution. The use of lubrication also appears to decrease the depth of the center dead zones in the wire by creating a more uniform stress distribution in the short transverse direction. At breakdown reductions greater than the optimum reduction, minimizing the depth of the center dead zones is an essential factor in maintaining high performance which is not easily achieved by prior art methods.

Figure 3:
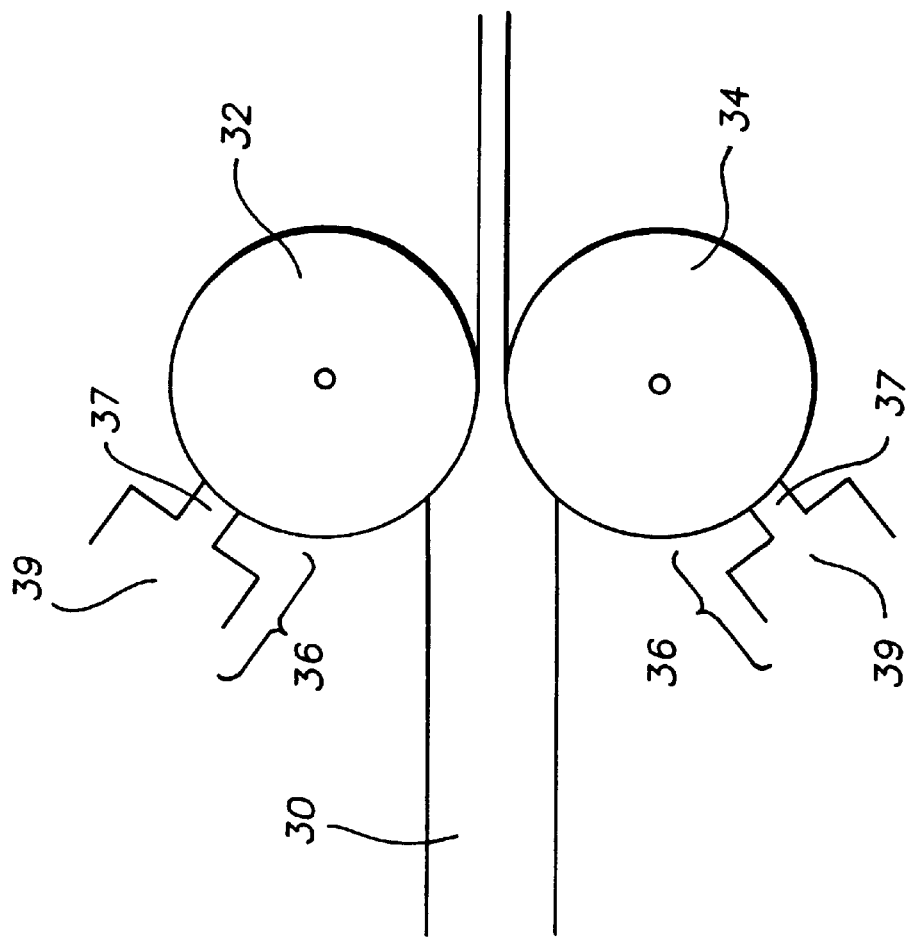
FIG. 3 is a schematic diagram of a rolling apparatus in accordance with the invention.

Lubrication may be applied directly to the precursor article prior to roll working, but is preferably applied to the rolls themselves. Best results are obtained if an even coat of lubricant is continuously applied. FIG. 3 is a schematic drawing of rolling equipment in accordance with the invention. Precursor article 30 stages between rollers 32 and 34, each of which is equipped with a lubrication device 36, including an applicator 37 contacting the roller 32 or 34, and an optional lubricant reservoir 39. Typically, a lubricant-saturated cloth wrapped around a block of wood or some other suitable material may function as both applicator 37 and reservoir 39. Alternatively, an auxiliary roller-and-well arrangement may be used. Any lubricant which will not breakdown under the applied pressure may be used. Liquid lubricants, such as water and high-grade motor oils are the preferred lubricants. However, solid lubricants such as graphite powders and molybdenum disulfide may be used. Alternative roll treatments such as polishing, or a polytetrafluoroethylene coating such as the "Teflon" coating available from E.I. Dupont de Nemours of Wilmington, Del., may also be used to reduce the coefficient of friction between the roll and the precursor article less than about 0.2.

Lubrication is particularly effective in combination with a high reduction breakdown stage, by which is meant that the total reduction achieved in the breakdown stage be on the order of 40% to 95%. Any number of drafts may be used during the breakdown stage provided that lubrication is used during all roll working drafts. It is preferred that the pressure during each draft be at least 1 MPa, and preferably at least 10 MPa. Processes in which there is at least one high reduction roll working draft during the breakdown stage are preferred. Processes in which there is a single high reduction draft in the breakdown stage are most preferred. Most preferably, no further reduction of the article in excess of about 10% and preferably 5%, occurs during the breakdown stage after that high reduction roll working draft and before the sintering operation.

The use of lubrication in combination with a single high reduction draft in the breakdown stage has been found to improve tape width and thickness variability in both the rolled precursor article and the superconducting composite article by 30% to 100% and typically on the order of 50% to 75%, to less than about 1% of the average width and thickness of the article. In the rolled precursor, variations in tape width are typically reduced below about 50 microns, while variations in tape thickness are typically reduced below about 10 microns. Within the superconducting article and its precursor, filament shapes and uniformity are also improved. Typically, in both articles, the aspect ratio of each filament is at least about 15% of the aspect ratio of the article, even in the barrel and dead zones where low aspect ratio filaments are typical of prior art composites. In addition, low friction roll working during the breakdown stage reduces longitudinal filament non-uniformities and short transverse shearing defects such as multimodal transverse shearing, which also contributes to an improved $J_e$.

The invention may be further understood from the following examples:

EXAMPLES 1

This example illustrates the effect of the invention on longitudinal filament uniformity and filament homogeneity for an 85 filament superconducting composite oxide tape.

A mixture of Bi, Pb, Sr, Ca, and Cu nitrates with metal ratios of 1.74:0.34:1.91:2.03:3.07 was calcined at 650° C. for 0.25–1.5 hours and then ground to reduce the particle size of the oxide powder. The powder was reacted in air at 780–830° C. for 6–10 hours and finally heat treated in pure oxyen at 780–830° C. for 6–10 hours, forming tetragonal BSCCO 2212, $Ca_2PbO_4$ and CuO phases. The powder was packed into a pure silver billet of 1.235" (3.14 cm) OD and 0.906" (2.3 cm) ID. The loaded billet was drawn to a hexagonal monofilament wire of 0.07" (0.18 cm). This wire was cut into 85 equal pieces and bundled into a 0.84" (2.13 cm) OD and 0.76" (1.93 cm) ID silver tube. The bundled 85 filament tube was drawn down to a round wire of 0.0354" (0.9 mm). The wire was then annealed in order to convert the tetragonal BSCCO 2212 to an orthorhombic form, as further described in U.S. patent application. Ser. No. 08/467,033 entitled "Processing Of (Bi,Pb)SCCO Superconductor In Wires And Tapes", filed Jun. 6, 1995, which is herein incorporated by reference, and divided into two samples.

Figure 4A:
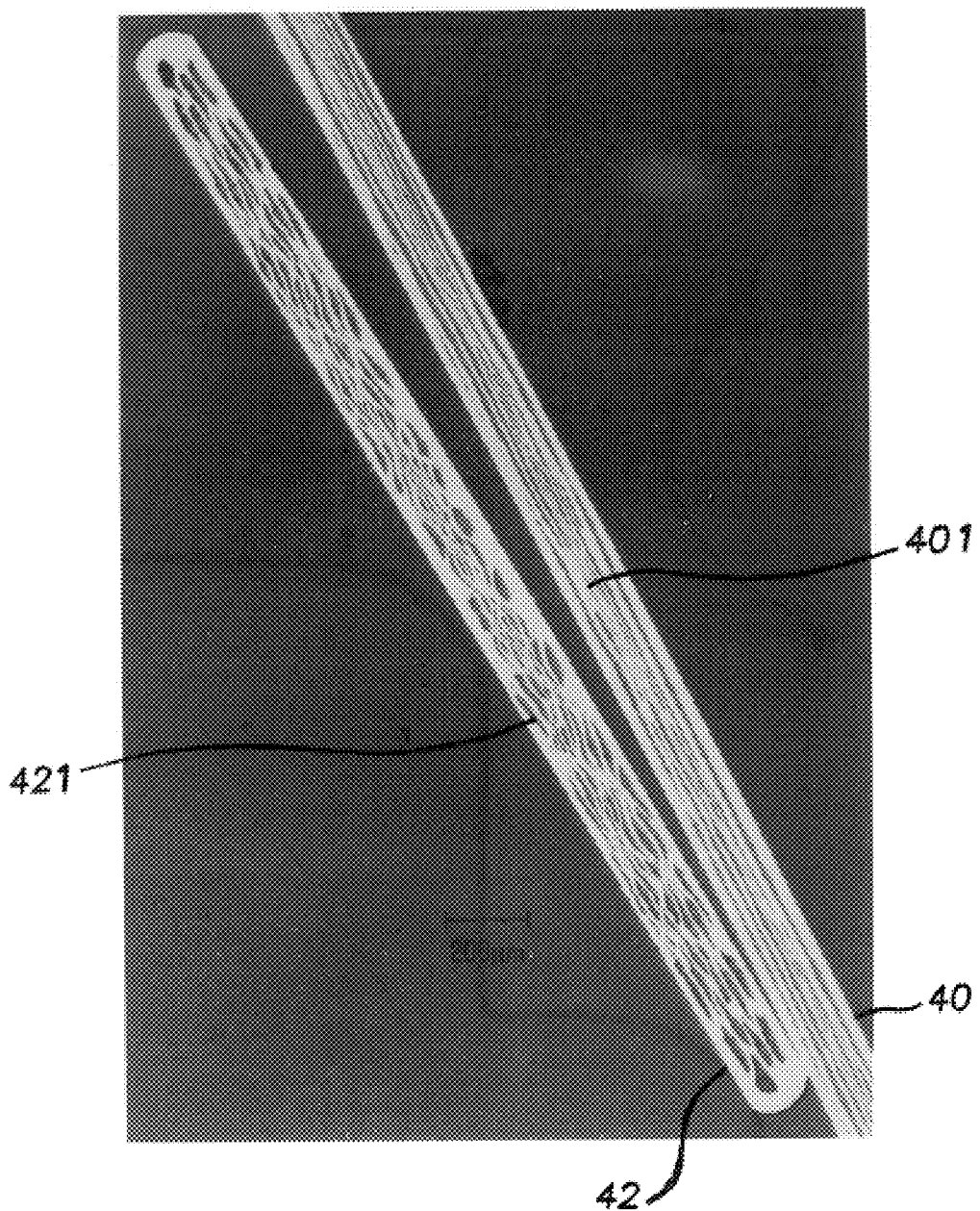
FIG. 4 is an optical photomicrograph of longitudinal and transverse cross-sections of (a) an elongated superconducting ceramic composite of the prior art, and (b) an elongated superconducting ceramic made in accordance with the invention.
Figure 4B:
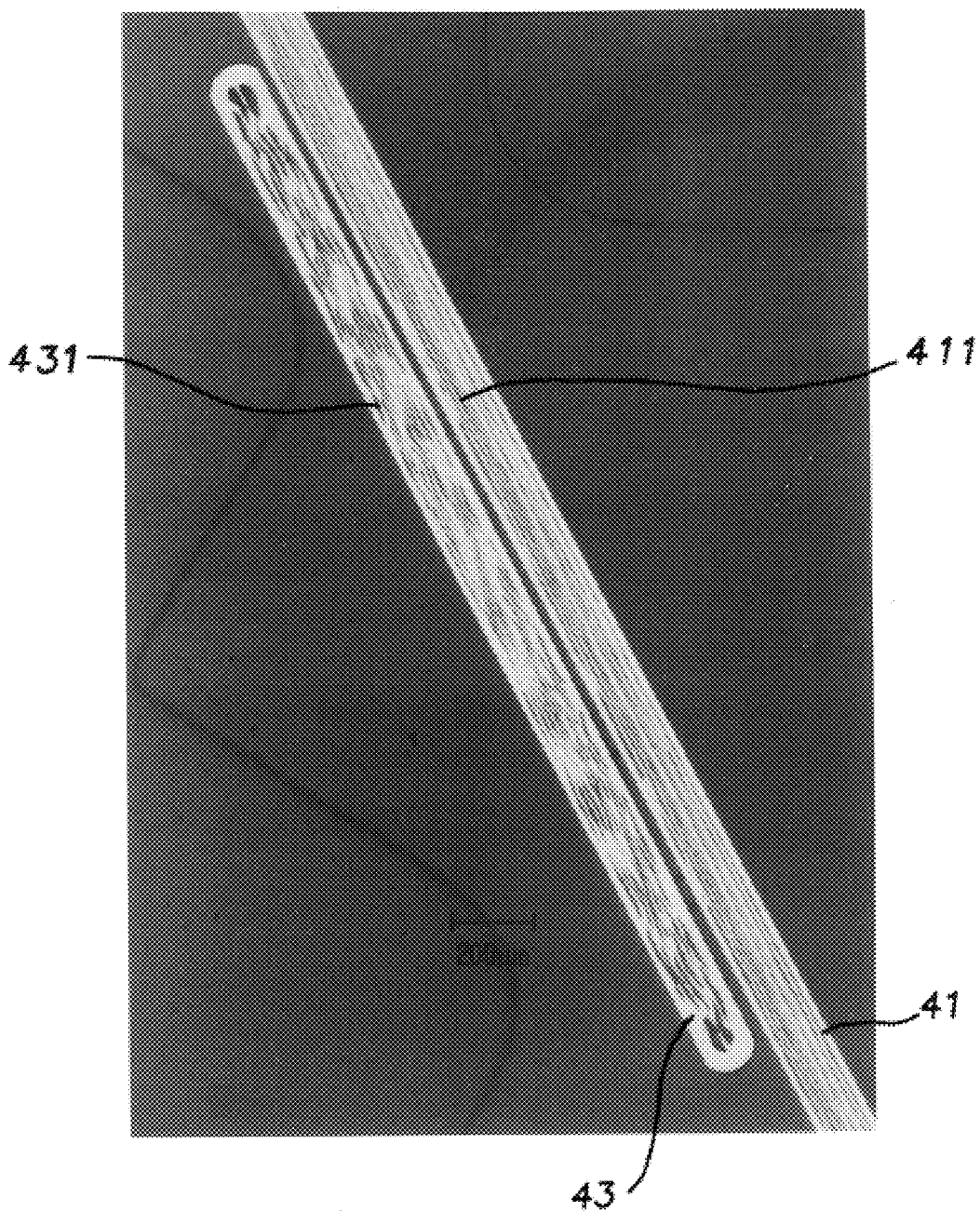

Both samples were rolled into 0.006" (0.15 mm) thick tapes by a single stage, high reduction rolling operation using a four inch (10 cm) roll using the same predetermined, constant roll gap. 10W-40 lubrication oil manufactured by Mobil Corporation of Houston, Tex., was applied during the reduction of one sample but not of the other. Lubricant application was accomplished by keeping each roll in constant contact with an oil-saturated cloth. A total reduction of 81.30% was achieved on the unlubricated sample and of 85.38% on the lubricated sample. FIG. 4 is an optical photomicrograph of (a) the longitudinal cross-section 40 and transverse cross-section 42 of the unlubricated sample of the prior art, and (b) the longitudinal cross-section 41 and transverse cross-section 43 the lubricated sample made in accordance with the invention, in which black regions are precursor filaments and white regions are matrix material. A comparison of filaments 401 and 411 shows more sausaging in the filaments of the unlubricated sample. A comparison of filaments 421 and 431 illustrates that the filaments in the barrel regions of the transverse cross-section of the lubricated sample are considerably more compact and uniform than their unlubricated counterparts.

EXAMPLE 2

This example illustrates the effect of the invention on tape uniformity for another 85 filament superconducting composite oxide tape.

A monofilamentary wire containing tetragonal BSCCO 2212, $Ca_2PbO_4$ and CuO phases was made in accordance with Example 1 above. The powder was packed into a pure silver billet of 1.235" (3.14 cm) OD and 0.765" (1.94 cm) ID. The loaded billet was drawn to a hexagonal monofilament wire of 0.07" (0.18 cm). This wire was cut into 85 equal pieces and bundled into a 0.84" (2.13 cm) OD and 0.76" (1.93 cm) ID silver tube. The bundled 85 filament tube was drawn down to a round wire of 0.0354" (0.9 mm). The wire was annealed as described above in order to convert the tetragonal BSCCO 2212 to an orthorhombic form and then divided into two samples.

Both samples were rolled into 0.006" (0.15 mm) thick tapes by a single stage, high reduction (80%) rolling operation using a four inch (10 cm) roll at a predetermined, constant roll gap. 10W-40 oil was applied during the reduction of one sample but not of the other. Lubricant application was accomplished by keeping each roll in constant contact with an oil-saturated cloth.

Figure 5:
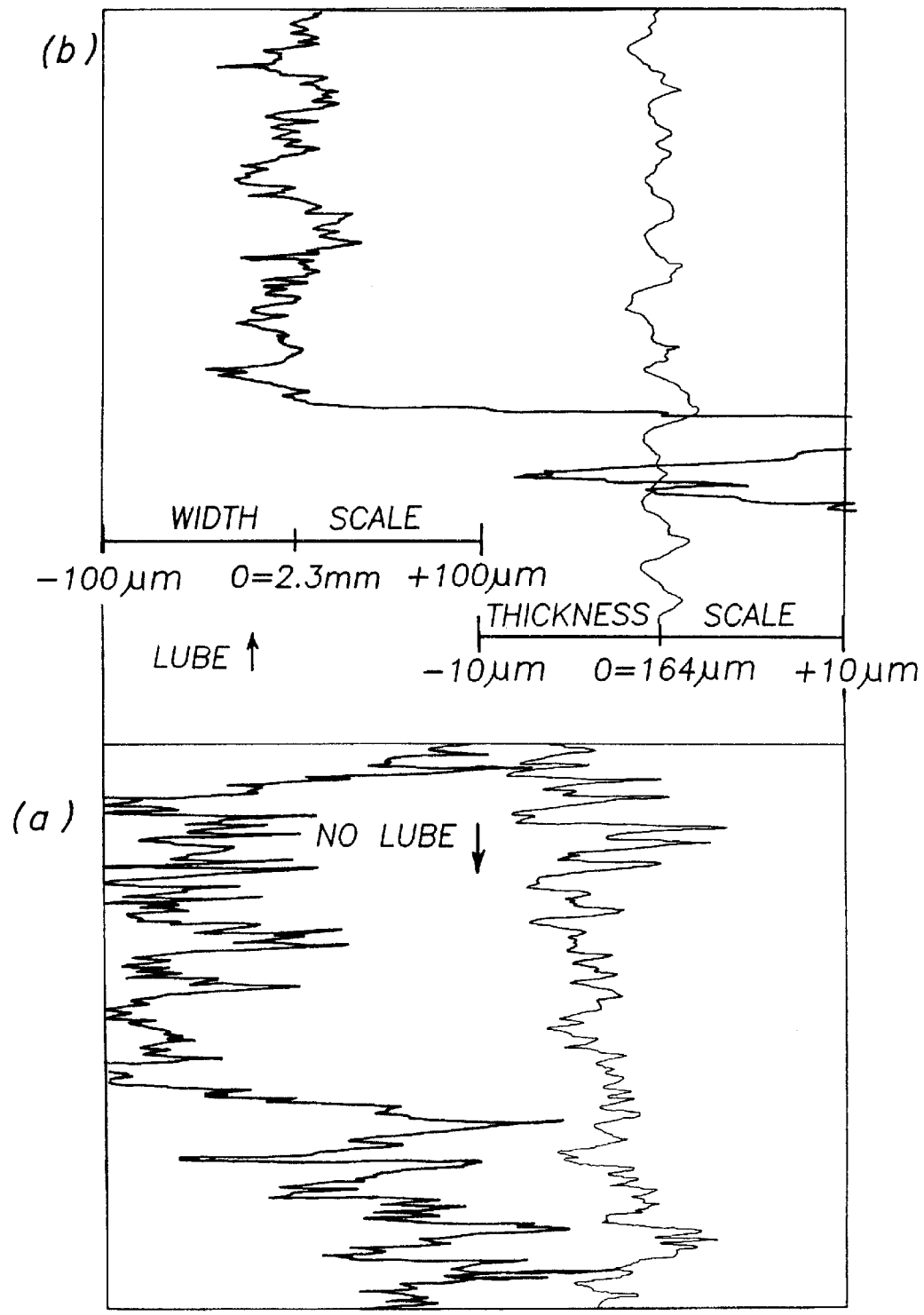
FIG. 5 is a chart of thickness and width measurements made during rolling of an elongated superconducting ceramic (a) in accordance with the prior art and (b) in accordance with the invention.

An electric chart recorder and a pair of precision real-time thickness (Volmer brand) gauges were connected to the rolling mill. After being rolled, the tape passed through these gauges, providing real-time thickness and width measurements. FIG. 5 is a chart of thickness and width measurements made during 1DS rolling of a single sample (a) without lubrication, in accordance with the prior art and (b) in accordance with the invention. The variation in the width of the sample was about 100 microns (0.00394") without lubrication and about 40 microns (0.00158") with lubrication. The variation in the thickness of the sample was about 16 microns (0.00063") without lubrication and about 6 microns (0.00024") with lubrication. In tests of numerous samples, manufactured under comparable but not identical conditions to those described in Examples 1 and 2, the lubricated rolling process provides a significantly more uniform tape, with average improvements in width and thickness variability on the order of 60%.

EXAMPLE 3

This example illustrates the effect of the invention on microhardness and dead zone reduction for several 85 filament tapes.

Samples made in accordance with Example 2 are rolled at a set of predetermined roll gaps, one sample being rolled with lubrication and one without at each setting. One of the Example 2 tapes (85.4% reduction) was rolled under partial lubrication conditions. Table 1 describes the average microhardness (Knoop Hardness Number with a load of 10 grams) and standard deviation (sigma) of filaments in the edge barrel zones, the center-edge dead zones and the center extension zone. Numbers in the rightmost columns are averages of the readings in the different zones.

TABLE 1

| Example 2 tape: (% reduction) | Edge | Sigma | Center | Sigma | Center | Sigma | Average |
|---|---|---|---|---|---|---|---|
| no lube (82.4%) | 100.2 | 26.6 | 172.2 | 1.4 | 164.6 | 11 | 145.7 |
| part lube (85.4%) | 99.3 | 18.4 | 116.2 | 12.5 | 132.4 | 12.3 | 116.0 |
| lube (86.4%) | 116.1 | 17.6 | 131.8 | 13.8 | 137.6 | 9.6 | 128.5 |
| lube (87.0%) | 139.5 | 31.6 | 144.2 | 21.7 | 137.2 | 18 | 140.3 |

The tapes made with ideal or partial lubrication have a lower average filament microhardness overall (about 110–140 for the lubricated samples versus 145–146 for the unlubricated samples) despite greater reductions in all lubricated samples. The lubricated samples tend to have a much more uniform distribution of filament microhardness across the various deformation zones, and the samples made with ideal lubrication have a more uniform distribution than the sample made with partial lubrication.

EXAMPLE 4

This example illustrates the effect of the invention on $J_e$ as a result of single draft breakdown rolling.

Figure 6:
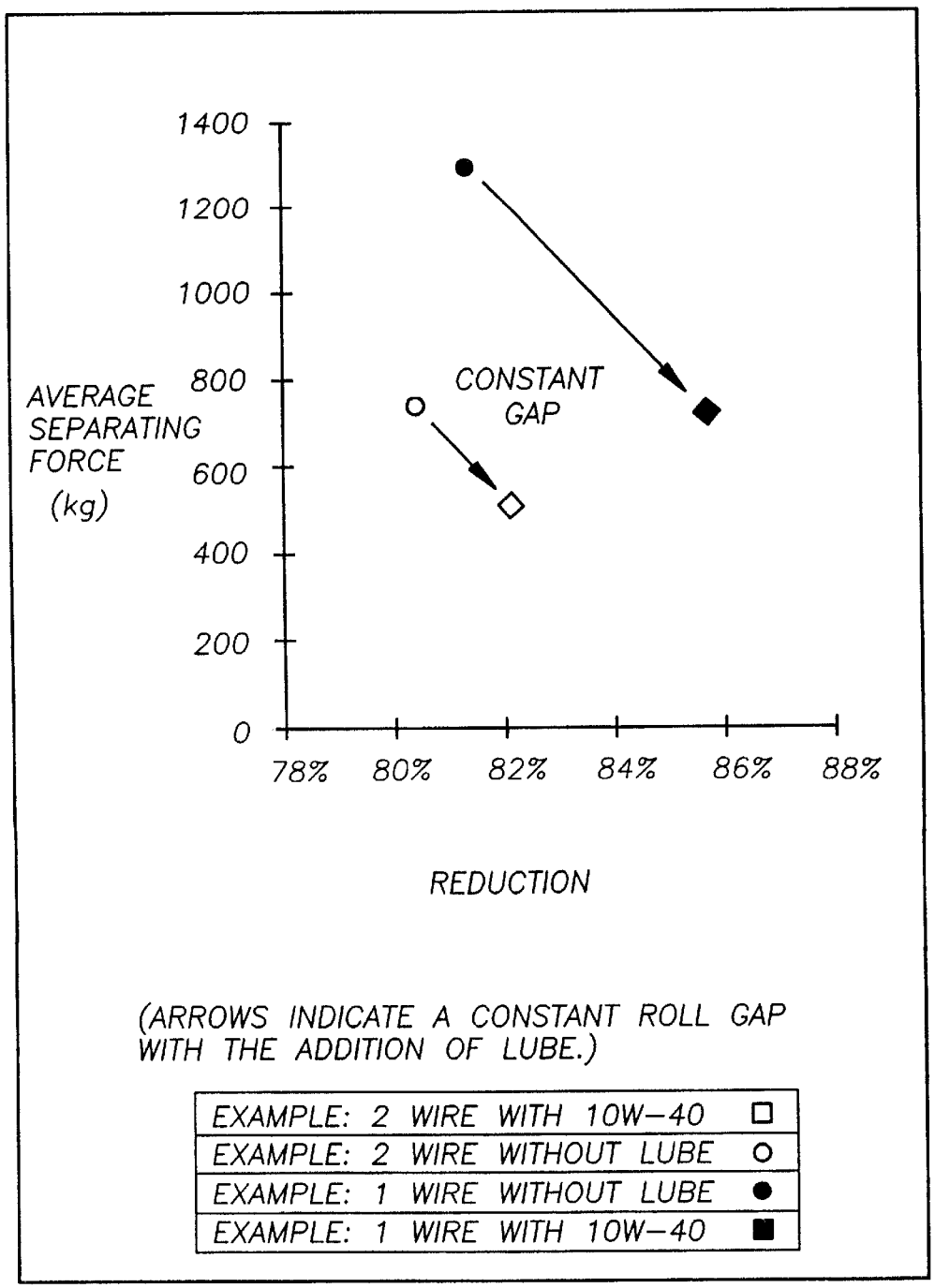
FIG. 6 is a graph showing average roll separating force as a function of reduction for lubricated and unlubricated samples at a constant roll gap.

Samples made in accordance with Example 1 or 2 were rolled as described above using either 10W-40 lubricant, Nalco 27F manufactured by Nalco Chemical Company, Chicago, Ill. (OPCOFILM 27F manufactured by Prochemco, Lake Station, Indiana, may also be used) or no lubricant at a series of reductions in the range of 72% to 88%. FIG. 6 shows average separating force as a function of reduction for lubricated and unlubricated samples at a constant roll gap. Separating force was reduced by almost half in the lubricated samples.

Figure 7:
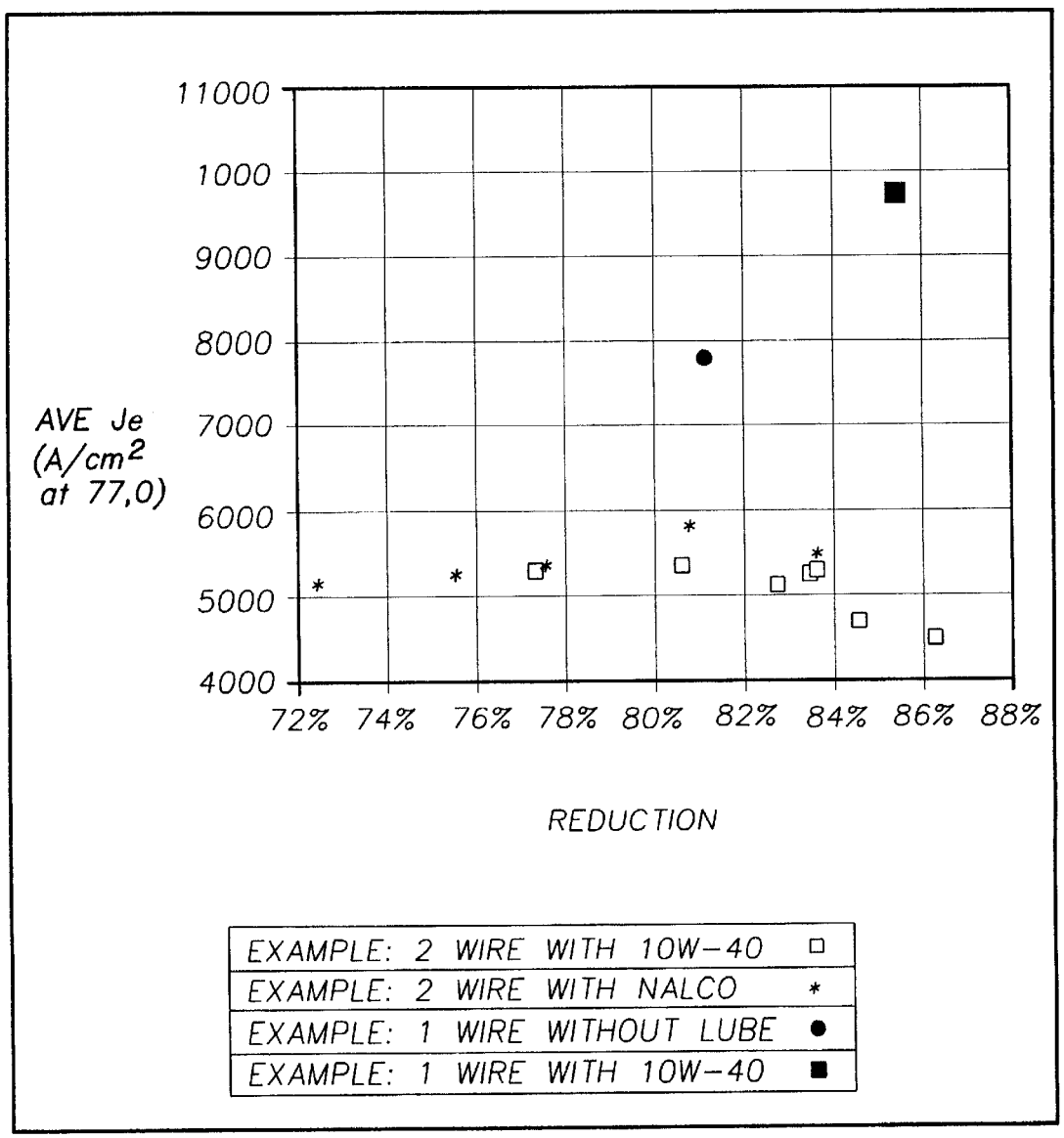
FIG. 7 is a graph showing average $J_e$ as a function of reduction for various lubricated and unlubricated samples in a 1DS process.

The samples were then heat treated at 790–850° C. for 10 to 100 hours and then at 650 to 750° C. for 10 to 100 hours to form and sinter the desired BSCCO 2223 superconducting oxide. FIG. 7 shows the average $J_e$ as a function of reduction for the lubricated and unlubricated samples. The lubricated sample outperformed the unlubricated sample significantly. Differences in $J_e$ between the Example 1 wire and the Example 2 wire are believed to be due to the higher superconductor content of the Example 1 wire. The higher viscosity lubricant had slightly higher $J_e$ values.

EXAMPLE 5

This example illustrates the effect of the invention on $J_e$ as a result of multiple draft breakdown rolling.

A monofilamentary wire containing tetragonal BSCCO 2212, $Ca_2PbO_4$ and CuO phases was made in accordance with Example 1 above. The powder was packed into a pure silver billet of 1.235" (3.14 cm) OD and 0.765" (1.94 cm) ID. The loaded billet was drawn to a hexagonal monofilament wire of 0.07" (0.18 cm). This wire was cut into 85 equal pieces and bundled into a 0.84" (2.13 cm) OD and 0.76" (1.93 cm) ID silver tube. The bundled 85 filament tube was drawn down to a round wire of 0.072" (0.18 cm) and divided into two samples for 3DS processing.

Both samples were rolled into 0.0141" (4 mm) thick tapes (a total reduction of about 80%) by a multidraft breakdown rolling sequence using one inch (2.54 cm) rolls at 5% reduction during each draft for the initial reduction to 0.03" (0.08 cm), and four inch (10 cm) rolls at 5% reduction during each draft for the remainder of the sequence. 10W-40 lubrication oil manufactured by Mobil Corporation of Houston, Tex., was applied to both rolls during the reduction of one sample but not of the other. Lubricant application was accomplished by keeping each roll in constant contact with an oil-saturated cloth.

The samples were then sintered at 790–850° C. for 1 to 100 hours in a nitrogen atmosphere with 7.5% oxygen. Each sample was then split into thirty-six segments. A first intermediate reduction stage of 15%, 20% or 25% was performed by roll working in a single draft on the four inch rolls, half at each reduction being with lubrication and half without. On completion of the first intermediate stage, there were six classes of six segments each. These segments were then sintered at 790–850 C. for 1 to 100 hours in a nitrogen atmosphere with 7.5% oxygen. A second intermediate reduction stage of 15%, 20% or 25% was performed by roll working each class of segments in multiple drafts on the four inch rolls. Segments which had not been lubricated during the first intermediate stage were not lubricated during the second intermediate stage and segments which had been lubricated during the first intermediate stage were lubricated during the second intermediate stage as well to reduce the number of variables so that all segments could be treated in a single furnace. The segments (two for each combination of conditions) were then sintered at 790–850° C. for 1 to 100 hours and 650–790° C. for 10 to 100 hours, all in a nitrogen atmosphere with 7.5% oxygen.

Figure 8:
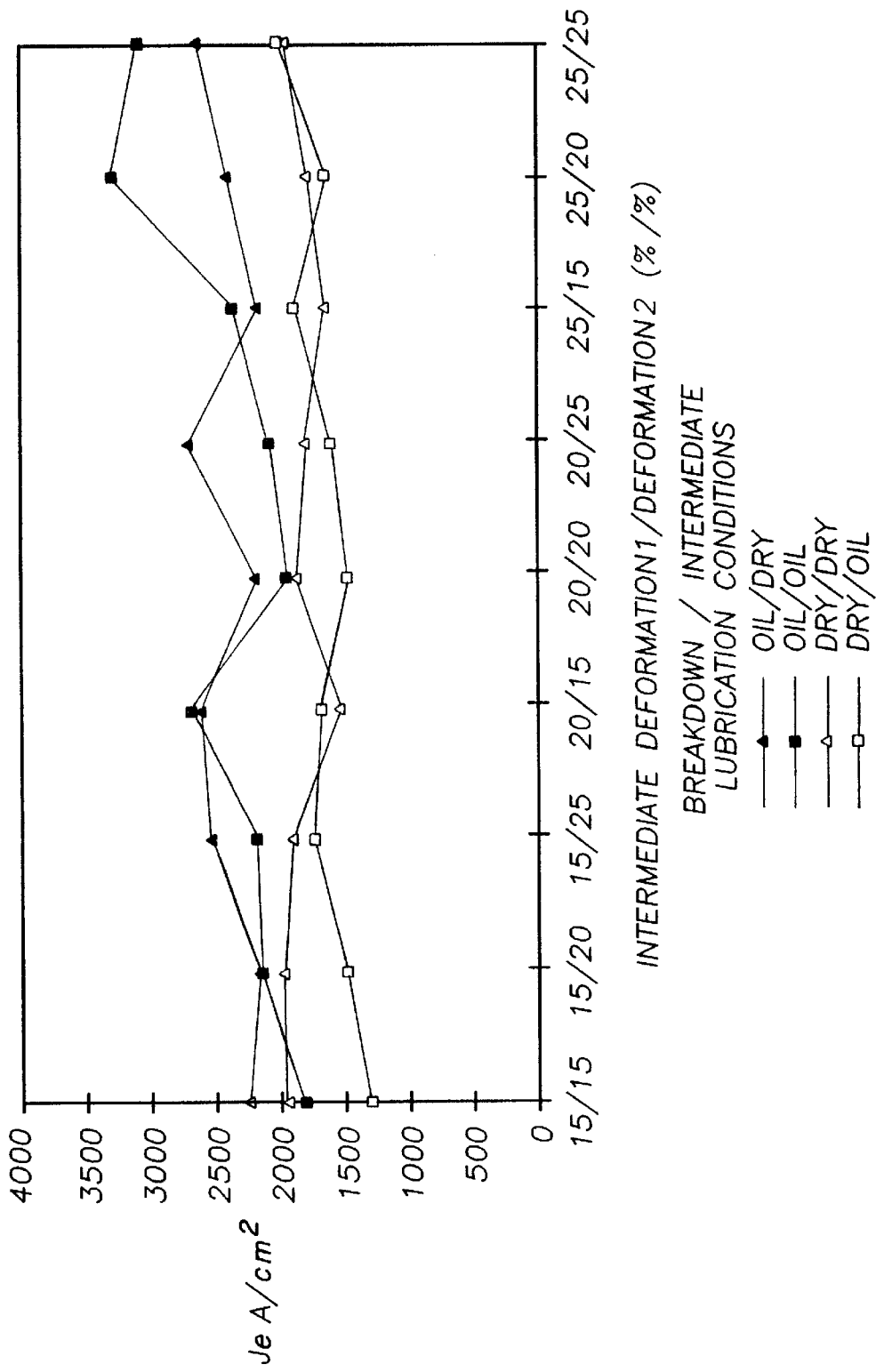
FIG. 8 is a graph showing average $J_e$ as a function of reduction for lubricated and unlubricated samples at the various combinations of processing conditions in a 3DS process.

FIG. 8 shows the average $J_e$ as a function of reduction for the lubricated and unlubricated samples at the various combinations of processing conditions. Analysis of variance of the results of Example 5 was performed. The most important parameter was the use of lubrication during breakdown rolling. A t-test showed an expected improvement of 30% to 48% (95% confidence interval) in $J_e$ for use of lubrication during the breakdown stage relative to the dry process. Use of lubrication during intermediate rolling was not found to have a statistically significant effect on $J_e$, although an interaction between lubrication during intermediate rolling and the optimal amount of deformation during the first intermediate stage was found to be statistically significant.

EXAMPLE 6

This example illustrates the effect of the invention on microhardness composite uniformity for an 85 filament tape.

Samples made in accordance with Example 2 are rolled with 10W-40 lubrication and without. Table 2 describes the average microhardness (Knoop Hardness Number) of the silver matrix and the precursor filaments in the edge barrel zones, the center-edge dead zones and the center extension zone. Numbers in the leftmost columns are averages of the readings in the different zones.

TABLE 2

|  | Edge | Sigma | Center-edge | Sigma | Center | Sigma |
|---|---|---|---|---|---|---|
| tape — no lube: |  |  |  |  |  |  |
| Ag matrix (86.0) | 81.4 | 4.9 | 62.9 | 4.9 | 113.7 | 6.0 |
| Filaments (145.7) | 100.2 | 26.6 | 172.2 | 1.4 | 164.6 | 11.0 |
| tape — part lube: |  |  |  |  |  |  |
| Ag matrix (94.7) | 88.1 | 7.1 | 84.4 | 9.8 | 111.7 | 6.3 |
| Filaments (116.0) | 99.3 | 18.4 | 116.2 | 12.5 | 132.4 | 12.3 |

The tape made with lubrication has a lower average filament microhardness overall (116.0 for the partly lubricated sample versus 145.7 for the unlubricated sample). It has a more uniform distribution of filament microhardness across the various deformation zones. The change in filament microhardness is most pronounced in the center-edge dead zones, which have the highest microhardness of the three zones in the sample made without lubrication but not in the sample made with lubrication.

The tape made with lubrication has higher matrix microhardness in the barrel zones and dead zones but slightly lower matrix microhardness in the center extension zone. Overall, the matrix hardness is higher and more uniform in this tape (94.7 for the lubricated sample versus 86.0 for the unlubricated sample).

The differences in microhardness between the filaments and the matrix are significantly reduced in all three deformation zones. The variation in the edge barrel zones is 21% for the unlubricated sample and 12% for the lubricated sample. The variation in the center-edge dead zones is 93% for the unlubricated sample and 32% for the lubricated sample. The variation in the center extension zone is 37% for the unlubricated sample and 17% for the lubricated sample. The overall variation of the microhardness is less than 20% for the lubricated sample and over 50% for the unlubricated sample.

EXAMPLE 7

This example illustrates the effect of the invention on $J_e$ as a result of a 2DS process including single draft breakdown rolling.

An 85 filament wire was made in accordance with Example 1. It was rolled into 0.006" (0.15 mm) thick tapes by a single stage, high reduction (80%) rolling operation using a four inch (10 cm) roll at a predetermined, constant roll gap. 10W-40 oil was applied during the reduction by keeping each roll in constant contact with an oil-saturated cloth. The sample was then sintered at 790–850° C. for 1 to 100 hours. A first intermediate reduction stage of 10% was performed by roll working in a single draft on the four inch rolls, without lubrication. The sample was then sintered at 790–850° C. for 1 to 100 hours and 650–790° C. for 10 to 100 hours, all in a nitrogen atmosphere with 7.5% oxygen. The average $J_e$ of this tape was measured by taking 2 Ic measurements on each of 2 2" (5.08 cm) samples. The average $J_e$ was 13,884 Amps/$cm^2$.

It should be readily apparent to those skilled in the art that the methods and advantages of the present invention may be used in all multifilamentary superconducting articles having a variety of compositions and morphologies. The description and examples are set forth in the specification for the purposes of illustration only and are by no means intended to be limiting of the invention. The scope and nature of the invention are set forth in the claims which follow.

What is claimed is:

1. A method for manufacturing a multifilamentary superconducting ceramic composite article comprising the steps of:

providing a precursor article comprising a plurality of filaments extending along the length of the article and containing precursors to a desired superconducting ceramic, and a metal matrix substantially surrounding each filament;

roll working the precursor article during a breakdown stage at a predetermined pressure and a coefficient of friction less than about 0.2 during each roll working draft, and sintering the rolled article to obtain the desired superconducting ceramic.

2. A method according to claim 1 wherein the coefficient of friction is less than about 0.01 during each roll working draft.

3. A method according to claim 2 wherein the coefficient of friction is less than about 0.001 during each roll working draft.

4. A method according to claim 1 wherein the desired superconducting ceramic is a superconducting oxide.

5. A method according to claim 4 wherein the desired superconducting oxide is one of the bismuth-strontium-calcium-copper-oxide superconducting phases.

6. A method according to claim 1 wherein the breakdown stage is a high reduction breakdown stage.

7. A method according to claim 6 in which there is at least one high reduction roll working draft during the breakdown stage.

8. A method according to claim 7 wherein no further reduction of the article in excess of about 10% occurs during the breakdown stage after the high reduction roll working draft and before the sintering operation.

9. A method according to claim 8 wherein no further reduction of the article in excess of about 5% occurs during the breakdown stage after the high reduction roll working draft and before the sintering operation.

10. A method according to claim 1 which is an nDS process.

11. A method according to claim 9 where n is an integer no less than 1 and no greater than 5.

12. A method according to claim 1 wherein the pressure is greater than about 1 MPa during each roll working draft.

13. A method according to claim 1 wherein the pressure is greater than about 10 MPa during each roll working draft.

14. A method for manufacturing a multifilamentary superconducting ceramic composite article comprising the steps of:

providing a precursor article comprising a plurality of filaments which comprise precursors to a desired superconducting ceramic extending along the length of the article, and a metal matrix substantially surrounding each filament;

roll working the precursor article during a breakdown stage at a predetermined pressure while using a lubricant between the article and one or more rolls during at least one roll working draft; and, sintering the rolled article to obtain the desired superconducting ceramic.

15. A method according to claim 14 wherein the lubricant is selected to create ideal lubrication conditions between the article and one or more rolls during at least one roll working draft.

16. A method according to claim 14 wherein the desired superconducting ceramic is a superconducting oxide.

17. A method according to claim 14 wherein the lubricant is a liquid lubricant.

18. A method according to claim 17 wherein the lubricant is an oil.

19. A method according to claim 14 wherein the lubricant is a solid lubricant.

20. A method according to claim 18 wherein the lubricant is a graphite powder.

21. A method according to claim 14 wherein the breakdown stage is a high reduction breakdown stage.

22. A method according to claim 21 in which there is at least one high reduction roll working draft during the breakdown stage.

23. A method according to claim 22 wherein no further reduction of the article in excess of about 5% occurs during the breakdown stage after the high reduction roll working draft and before the sintering operation.

24. A method according to claim 14 which is an nDS process.

25. A method according to claim 24 where n is an integer no less than 1 and no greater than 5.

26. A method according to claim 25 in which n is an integer greater than 1 and lubricant is not used during roll working after the breakdown stage.

27. A method according to claim 25 in which n is an integer greater than 1 and lubricant is used during roll working after the breakdown stage.

28. A method according to claim 16 wherein the desired superconducting oxide is one of the bismuth-strontium-calcium-copper-oxide superconducting phases.

29. A method according to claim 28 wherein the desired superconducting oxide is BSCCO 2223.

30. A method according to claim 28 wherein the desired superconducting oxide is BSCCO 2212.

31. A method according to claim 16 wherein the desired superconducting oxide is one of the yttrium-barium-copper-oxide superconducting phases.

32. A method according to claim 31 wherein the desired superconducting oxide is YBCO 123.

33. A method according to claim 31 wherein the desired superconducting oxide is YBCO 124.

34. A method according to claim 31 wherein the desired superconducting oxide is YBCO 247.

35. A method according to claim 16 wherein the desired superconducting oxide is one of the thallium-barium-calcium-copper-oxide phases.

36. A method according to claim 35 wherein the desired superconducting oxide is Tl 1223.

37. A method according to claim 35 wherein the desired superconducting oxide is Tl 1212.

* * * * *